US005889139A

United States Patent [19]

Fay et al.

[11] Patent Number: 5,889,139

[45] **Date of Patent: *Mar. 30, 1999**

[54] DIMENSIONALLY STABLE ETHER-CONTAINING POLYIMIDE COPOLYMERS

[75] Inventors: Catharine C. Fay, Yorktown; Anne K. St. Clair, Poquoson, both of Va.

[73] Assignee: The United States of America as represented by the Administrator of the National Aeronautics and Space Administration, Washington, D.C.

[ * ] Notice: The term of this patent shall not extend beyond the expiration date of Pat. No. 5,212,283.

[21] Appl. No.: 816,946

[22] Filed: Feb. 28, 1997

[51] Int. Cl.[6] ............................ C08G 73/10; C08G 69/26

[52] U.S. Cl. .......................... 528/353; 528/125; 528/128; 528/172; 528/173; 528/179; 528/183; 528/185; 528/188; 528/220; 528/229; 528/350; 428/411.1; 428/473.5; 525/420

[58] Field of Search .................................... 528/353, 125, 528/128, 172, 173, 179, 183, 185, 188, 220, 229, 350; 428/473.5, 411.1; 525/420

[56] References Cited

U.S. PATENT DOCUMENTS

| | | | |
|---|---|---|---|
| 5,166,292 | 11/1992 | Pottiger et al. | 526/59 |
| 5,177,176 | 1/1993 | Auman | 528/188 |
| 5,202,412 | 4/1993 | Auman | 528/353 |
| 5,210,174 | 5/1993 | Tamai et al. | 528/353 |
| 5,212,283 | 5/1993 | St. Clair | 528/353 |

*Primary Examiner*—P. Hampton-Hightower
*Attorney, Agent, or Firm*—Hillary T. Womack

[57] ABSTRACT

Novel polyimide copolymers containing ether linkages were prepared by the reaction of an equimolar amount of dianhydride and a combination of diamines. The polyimide copolymers described herein possess the unique features of low moisture uptake, dimensional stability, good mechanical properties, and moderate glass transition temperatures. These materials have potential application as encapsulants and interlayer dielectrics.

21 Claims, No Drawings

DIMENSIONALLY STABLE ETHER-CONTAINING POLYIMIDE COPOLYMERS

ORIGIN OF INVENTION

The invention described herein was jointly made by an employee of the United States Government and a research associate with the National Research Council and may be manufactured and used by or for the Government for governmental purposes without payment of any royalties thereon or therefor.

BACKGROUND OF THE INVENTION

1. Technical Field of the Invention

This invention relates generally to polyimide random copolymers. In particular it relates to polyimide copolymers containing ether linkages. Polyimide copolymers were synthesized using an equimolar amount of dianhydride and a combination of diamines. Additionally, copolymers of controlled molecular weight were synthesized.

2. Description of Related Art

Polyimides comprise a large family of heterocyclic polymers which were first prepared in the late 1950's. Since then a large volume of information has been generated concerning the synthesis, characterization, use, and physical and mechanical properties of these polymers. Polyimides have been extensively evaluated for aerospace and microelectronic applications because of their excellent thermal stability, low density, chemical resistance, and their good electrical and mechanical properties.

Polyimides are the first choice as material candidates for dielectrics because of their successful use in printed circuit boards, and planarization properties. Additional properties necessary for dielectric applications include: ease of processing, good adhesion, chemical resistance, low moisture uptake, thermal stability, low CTE, and cost effectiveness [Rothman, L. B. J. Electrochem. Soc. 1980, 127, 2216].

Polyimides must possess high heat resistance because device processing may require sealing, packaging, die bonding, wirebonding, and soldering. Thermal stresses occur if there is a mismatch in the CTE of the polyimide and the substrate, resulting in peeling and cracking. A low CTE minimizes these effects. Additionally, a low dielectric constant is required to minimize propagation delay, interconnect capacitance, and crosstalk between lines; this allows circuits to be run at a lower power input [Monk, D. J.; Soane, D. S. In *Polymers for Electronic and Photonic Applications*; Wong, C. P., Ed.; Academic Press, Inc., 1993; p 119–165]. The dielectric constant of commercial polyimide film changes with absorbed moisture, reducing its overall performance, so a material with low moisture uptake is desirable.

Polyimides containing 1,2-bis(4-aminoanilino) cyclobutene-3,4-dione (SAPPD) were developed because of their low CTE. The first reports of a polyimide utilizing SAPPD appeared in 1993 [St. Clair, T. L. U.S. Pat. No. 5,212,283, 1993 and Croall, C. I.; St. Clair, T. L.; Yumino, Y.; Mutoh, H.; and Ito, Y., "Polyimides Containing Squaric Acid Derivatives" presented at the Symposium on Recent Advances in Polyimides and Other High Performance Polymers, Reno/Sparks, Nev., Jan. 18–21, 1993]. The main focus of the patent was linear polyimides containing the cyclobutene-3,4-dione moiety. These polyimides exhibited glass transition temperatures greater than 500° C. and adhered tenaciously to glass. The main focus of the presentation was polyimides containing the cyclobutene-3,4-dione moiety for space applications. Several polyimides were synthesized and subsequently exposed to 1 MeV electrons. Mechanical properties were evaluated before and after electron radiation exposure. Polyimides prepared with 1,2-bis (4-aminoanilino)cyclobutene-3,4-dione (SAPPD) possess relatively low coefficients of thermal expansion but have somewhat lower thermal stability than commercial polyimide film.

Although these polyimides prepared with SAPPD have an extremely low CTE, their high glass transition temperatures are undesirable. Also, these polymers have further undesirable characteristics such as low thermal stability, outgasing problems and lack of flexibility. Traditionally, polyimides with low CTE's also have high glass transition temperatures. For the microelectronics industry, low CTE polymers are required which also possess good dimensional stability with low glass transition temperatures to allow for processing. Typically, low CTE polymers are either crystalline or rigid, and thus not processable. By the present invention, copolyimides were developed that have both low CTEs, as well as, low glass transition temperatures. These copolyimides contain ether linkages and may include the 1,2-bis(4-aminoanilino)cyclobutene-3,4-dione diamine.

SUMMARY OF THE INVENTION

A primary object of the invention is to provide new polyimide copolymers containing ether linkages which are useful as encapsulants and interlayer dielectrics. Another object is to provide new polyimide copolymers which have moderate glass transition temperatures, good mechanical properties, low moisture absorption, low coefficients of thermal expansion, and high thermal stability.

Novel polyimide copolymers were prepared using a equimolar amount of dianhydride and a combination of diamines. Polyimide copolymers utilized either (1) hydroquinone diether dianhydride (HQDEA) and a combination of 4,4'-oxydianiline (4,4'-ODA) and 1,2-bis(4-aminoanilino) cyclobutene-3,4-dione (SAPPD); (2) oxydiphthalic dianhydride (ODPA) and a combination of 3,4'-oxydianiline (3,4'-ODA) and 1,2-bis(4-aminoanilino)cyclobutene-3,4-dione (SAPPD); (3) oxydiphthalic dianhyrdride (ODPA) and a combination of 3,4'-oxydianiline (3,4'-ODA) and p-phenylene diamine (p-PDA) or (4) benzophenone tetracarboxylic dianhydride (BTDA) and a combination of 4,4'-oxydianiline (4,4'-ODA) and p-phenylene diamine (p-PDA). These reactions were carried out in a polar solvent, such as N,N-dimethylacetamide (DMAc) or N-methylpyrollidone (NMP) at room temperature (RT) under nitrogen to give high molecular weight poly(amide acid) solutions. In some cases, the molecular weight was controlled by offsetting stoichiometry and endcapping. The poly(amide acid) solutions were cast as films and thermally cured to achieve cyclization to the polyimide.

DESCRIPTION OF THE PREFERRED EMBODIMENTS

Preparation of dimensionally stable polyimide copolymers according to the present invention involves the reaction of two diamines in a solvent with an aromatic dianhydride according to the following

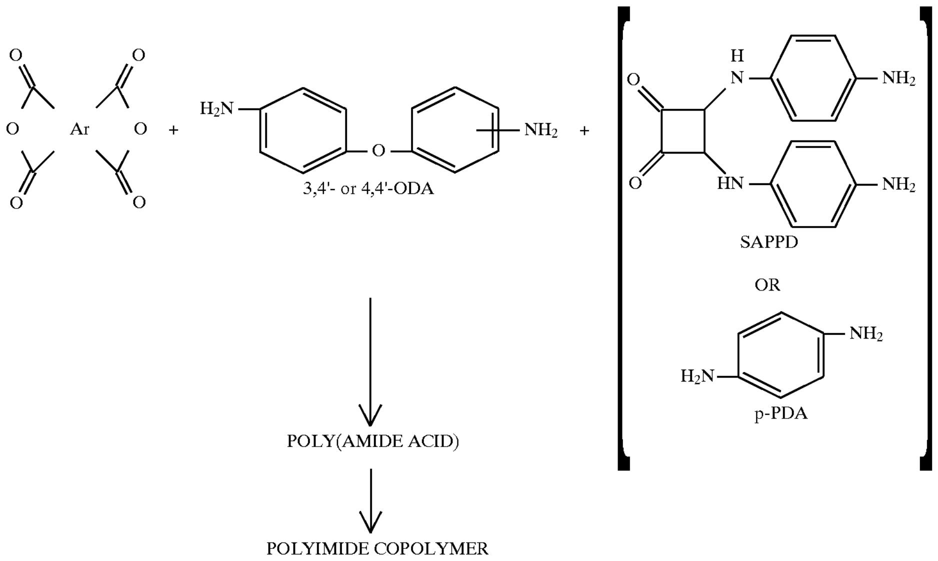

Tables 1–4 summarize the polyimide copolymer compositions (i.e. 0–100 molar percent diamine), inherent viscosity data ($\eta_{inh}$), glass transition temperatures ($T_g$), weight loss profiles (TGA), and coefficients of thermal expansion (CTE) for the polyimide copolymers. Tables 5–8 summarize the tensile strengths, moduli, and elongations for the polyimide copolymers. Tables 9–12 summarize the moisture absorption data of selected copolymers.

TABLE 1

Characterization Of HQDEA + 4,4'-ODA:SAPPD Copolymers

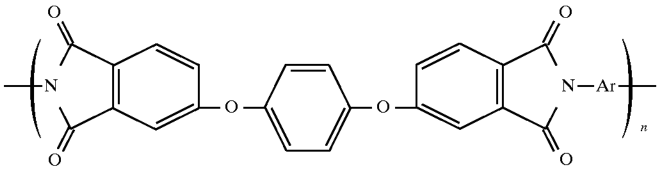

Ar

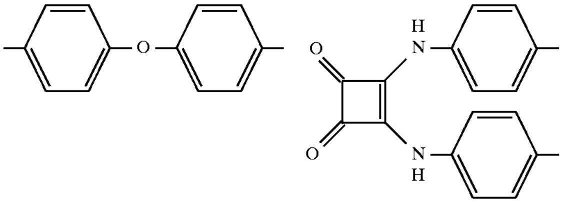

| molar % | molar % | $\eta_{inh}$, dL/g | $T_g$ by DSC, °C. | $T_g$ by TMA, °C. | TGA, 10% wt. loss, °C. | CTE, ppm/°C. |
|---|---|---|---|---|---|---|
| 0 | 100 | 2.72 | ND | ND | 407 | ND |
| 50 | 50 | 2.35 | ND | 277 | 470 | 35.5 |
| 60 | 40 | 1.45 | 254 | 274 | 474 | 37.0 |
| 70 | 30 | 1.03 | 271 | 258 | 496 | 39.9 |
| 75 | 25 | 1.42 | 266 | 256 | 503 | 38.9 |
| 90 | 10 | 1.18 | 251 | 244 | 516 | 42.6 |
| 100 | 0 | 0.93 | 240 | 231 | 525 | 40.0 |

ND = not detected

TABLE 2
Characterization Of ODPA + 3,4'-ODA:SAPPD Copolymers
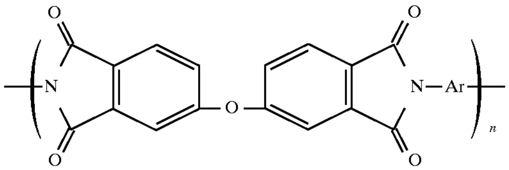
Ar
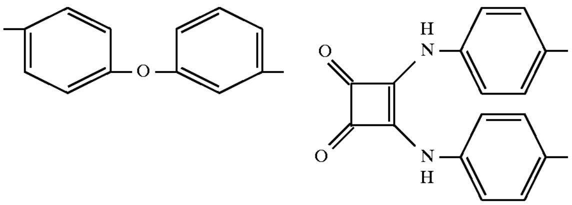
| molar % | molar % | $\eta_{inh}$, dL/g | $T_g$ by DSC, °C. | $T_g$ by TMA, °C. | TGA, 10% wt. Loss, °C. | CTE, ppm/°C. |
|---|---|---|---|---|---|---|
| 0 | 100 | 1.12 | ND | ND | 422 | −2 to 6 |
| 50 | 50 | 1.14 | ND | ND | 456 | 30.8 |
| 75 | 25 | 1.19 | ND | 261 | 503 | 34.2 |
| 80 | 20 | 1.23 | 252 | 254 | 505 | 36.0 |
| 90 | 10 | 1.30 | 249 | 250 | 518 | 38.5 |
| 100 | 0 | 1.34 | 238 | 237 | 511 | 39.5 |
ND = not detected
TABLE 3
Characterization Of ODPA + 3,4'-ODA:p-PDA Copolymers
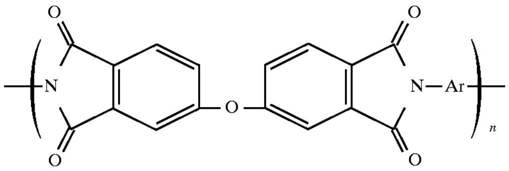
Ar
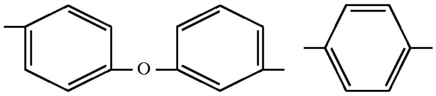
| molar % | molar % | $\eta_{inh}$, dL/g | $T_g$ by DSC, °C. | $T_g$ by TMA, °C. | TGA, 10% wt. Loss, °C. | CTE, ppm/°C. |
|---|---|---|---|---|---|---|
| 0 | 100 | 0.88 | ND | 350 | 533 | 26.0 |
| 50 | 50 | 1.08 | 265 | 301 | 514 | 28.7 |
| 55 | 45 | 0.73 | 259 | 256 | 516 | 28.1 |
| 60 | 40 | 1.28 | 251 | 255 | 527 | 33.0 |
| 65 | 35 | 0.89 | 257 | 249 | 525 | 32.6 |
| 70 | 30 | 0.95 | 257 | 247 | 518 | 34.4 |
| 75 | 25 | 1.32 | 248 | 245 | 516 | 37.3 |
| 90 | 10 | 0.70 | 248 | 243 | 528 | 37.9 |
| 100 | 0 | 1.34 | 238 | 237 | 511 | 39.5 |
ND = not detected TABLE 4
Characterization Of BTDA + 4,4'-ODA:p-PDA Copolymers
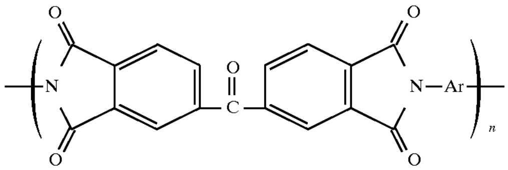
Ar
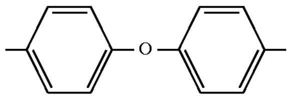
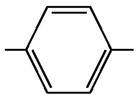
| molar % | molar % | $\eta_{inh}$, dL/g | $T_g$ by DSC, °C. | $T_g$ by TMA, °C. | TGA, 10% wt. Loss, °C. | CTE, ppm/°C. |
|---|---|---|---|---|---|---|
| 0 | 100 | 1.21 | ND | 341 | 516 | 16.6 |
| 50 | 50 | 1.49 | ND | 357 | 501 | 24.8 |
| 75 | 25 | 1.38 | 292 | 355 | 512 | 31.9 |
| 90 | 10 | 1.21 | 277 | 276 | 519 | 32.9 |
| 100 | 0 | 1.22 | 273 | 271 | 516 | 35.4 |
ND = not detected due to decomposition or outgassing of the polymer sample
TABLE 5
Mechanical Properties Of HQDEA + 4,4-ODA:SAPPD Copolymers
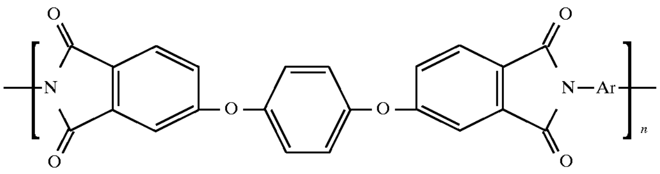
Ar
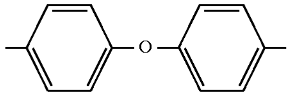
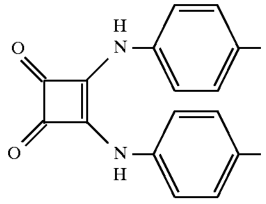
| molar % | molar % | Tensile strength, ksi | Tensile modulus, ksi | Elong., % |
|---|---|---|---|---|
| 0 | 100 | 21.4 | 666.4 | 7.8 |
| 50 | 50 | 17.6 | 456.1 | 11.3 |
| 60 | 40 | 17.2 | 387.2 | 11.1 |
| 70 | 30 | 15.9 | 385.2 | 10.7 |
| 75 | 25 | 17.8 | 387.6 | 42.7 |
| 90 | 10 | 16.6 | 376.9 | 42.2 |
| 100 | 0 | 23.8 | 370.2 | 93.1 |

TABLE 6
Mechanical Properties Of ODPA + 3,4'-ODA:SAPPD Copolymers
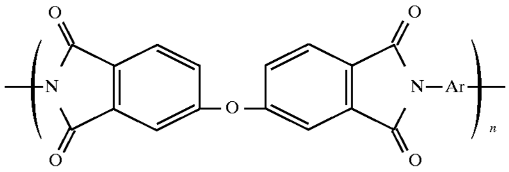
Ar
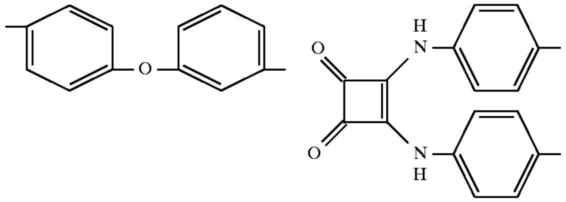
| molar % | molar % | Tensile strength, ksi | Tensile modulus, ksi | Elong., % |
|---|---|---|---|---|
| 0 | 100 | 25.9 | 873.3 | 6.4 |
| 50 | 50 | 18.8 | 601.4 | 4.2 |
| 75 | 25 | 18.5 | 494.4 | 9.6 |
| 80 | 20 | 20.7 | 463.2 | 10.6 |
| 90 | 10 | 18.6 | 439.0 | 63.4 |
| 100 | 0 | 16.9 | 421.5 | 28.1 |
TABLE 7
Mechanical Properties Of ODPA + 3,4'-ODA:p-PDA Copolymers
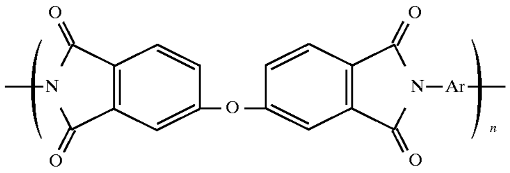
Ar
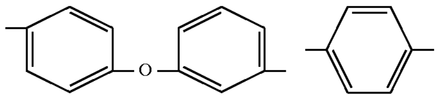
| molar % | molar % | Tensile strength, ksi | Tensile modulus, ksi | Elong., % |
|---|---|---|---|---|
| 0 | 100 | 30.0 | 832.3 | 14.7 |
| 50 | 50 | 21.5 | 534.4 | 6.5 |
| 55 | 45 | 21.6 | 531.1 | 21.8 |
| 60 | 40 | 21.1 | 505.6 | 27.6 |
| 65 | 35 | 19.3 | 418.2 | 51.6 |
| 70 | 30 | 19.2 | 456.1 | 9.2 |
| 75 | 25 | 18.9 | 371.9 | 47.8 |
| 90 | 10 | 17.9 | 363.9 | 33.1 |
| 100 | 0 | 16.9 | 421.5 | 28.1 |

TABLE 8

Tensile Properties Of BTDA + 4,4'-ODA:p-PDA Copolymers

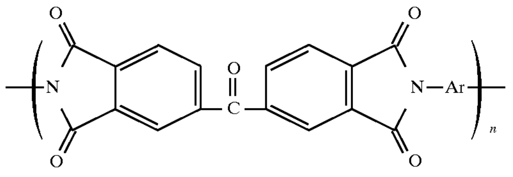

Ar

| 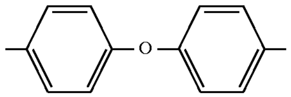 molar % | 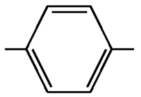 molar % | Tensile strength, ksi | Tensile modulus, ksi | Elong., % |
|---|---|---|---|---|
| 0 | 100 | 32.2 | 786.4 | 27.0 |
| 50 | 50 | 25.4 | 588.5 | 17.6 |
| 75 | 25 | 23.6 | 509.3 | 33.6 |
| 90 | 10 | 21.3 | 468.1 | 24.0 |
| 100 | 0 | 22.3 | 426.6 | 49.5 |

TABLE 9

Moisture Uptake Of HQDEA + 4,4'-ODA:SAPPD Copolymers

| Polyimide | Moisture Uptake (w/o) |
|---|---|
| HQDEA/SAPPD | 2.36 |
| 50:50 | 1.88 |
| 70:30 | 1.42 |
| 75:25 | 0.85 |
| HQDEA/4,4'-ODA | 0.83 |

TABLE 10

Moisture Uptake of ODPA + 3,4'-ODA:SAPPD Copolymers

| Polyimide | Moisture Uptake (w/o) |
|---|---|
| ODPA/SAPPD | 3.07 |
| 80:20 | 0.88 |
| ODPA/3,4'-ODA | 0.96 |

TABLE 11

Moisture Uptake of ODPA + 3,4'-ODA:p-ODA Copolymers

| Polyimide | Moisture Uptake (w/o) |
|---|---|
| ODPA/3,4'-ODA | 0.96 |
| 50:50 | 2.74 |
| 55:45 | 1.44 |
| 60:40 | 2.42 |
| 65:35 | 1.50 |
| 70:30 | 1.72 |
| 75:25 | 1.05 |
| 90:10 | 1.30 |
| ODPA/p-PDA | 1.22 |

TABLE 12

Moisture Uptake of BTDA + 4,4'-ODA:p-PDA Copolymers

| Polymer | Moisture Uptake (w/o) |
|---|---|
| BTDA/4,4'-ODA | 1.34 |
| 50:50 | 2.46 |
| 75:25 | 1.91 |
| 90:10 | 1.35 |
| BTDA/p-PDA | 2.12 |

Solubility of HQDEA+4,4'-DDA:SAPPD and ODPA+3,4'-ODA:SAPPD films was evaluated in NMP, DMAc, diglyme, DMF, and chloroform at intervals of 3 hr, 1 day, 3 days, and 5 days using a 1% solids concentration in a closed vial. Visual identification determined if the polyimides were soluble, partially soluble, or insoluble. Noted in the evaluations were discoloration of the solvent, swelling of the polymer, or other changes in the polymer film. Films in the HQDEA+4,4'-ODA:SAPPD series were insoluble. Films in the ODPA+3,4'-ODA:SAPPD series were insoluble.

The following specific examples are provided for purpose of illustration, and do not serve to limit the invention.

EXAMPLES

Example 1

Reaction of oxydiphthalic dianhydride (ODPA) with 3,4-oxydianiline (3,4'-ODA) and p-phenylene diamine (p-PDA).

Into a 100 ml, three-neck round bottom flask equipped with mechanical stirrer, nitrogen gas inlet, and drying tube containing calcium carbonate was placed p-phenylene diamine (p-PDA) (0.3104 g, 0.00287 mol), 3,4'-oxydianiline (3,4'-ODA) (1.0673 g, 0.00533 mol), and DMAc (20 g). The solution was stirred until the diamines dissolved. To this solution was added oxydiphthalic dianhydride (ODPA) (2.5438 g, 0.0082 mol) and DMAc (16.1808 g). The final solution concentration was 9.78% solids. The solution was stirred at room temperature (RT) overnight under a nitrogen atmosphere. A 0.5% solution of poly(amide acid) in DMAc had an inherent viscosity of 0.89 dL/g measured at 25° C. Thin films were cast from the poly(amide acid) solution and thermally cured by heating for one hour at 100°, 200°, and 300° C. in a forced air oven. The thin film exhibited a DSC of 257° C. and 10% weight loss by TGA occurred at 525° C. The film exhibited a mean tensile strength of 19.3 ksi, and a modulus and elongation of 418 ksi and 51.6% respectively, at room temperature. The coefficient of thermal expansion was 32.6 ppm/°C. Moisture uptake by weight was 1.50%.

Example 2

By the same method and conditions as described in Example 1 of the present invention, 2.5438 g of oxydiphthalic dianhydride (ODPA) was added to 0.8210 g of 3,4'-oxydianiline (3,4'-ODA) and 0.4434 g of p-phenylene diamine (p-PDA) dissolved in 36.6577 g of dimethylacetamide (DMAC) to form a poly(amide acid) resin having an inherent viscosity of 1.08 dL/g. Resulting polyimide films of ODPA+50:50 3,4'-ODA/p-PDA exhibited a $T_g$ by DSC of 265° C. and 10% weight loss by TGA occurred at 514° C. The film exhibited a mean tensile strength of 21.5 ksi, and a modulus and elongation of 534 ksi and 6.5% respectively, at room temperature. The coefficient of thermal expansion was 28.7 ppm/°C.

Example 3

By the same method and conditions as described in Example 1 of the present invention, 2.5438 g of oxydiphthalic dianhydride (ODPA) was added to 1.2315 g of 3,4'-oxydianiline (3,4'-ODA) and 0.2217 g of p-phenylene diamine (p-PDA) dissolved in 45.0169 g of dimethylacetamide (DMAc) to form a poly(amide acid) resin having an inherent viscosity of 1.32 dL/g. Resulting polyimide films of ODPA+75:25 3,4'-ODA/p-PDA exhibited a $T_g$ by DSC of 248° C. and 10% weight loss by TGA occurred at 516° C. The film exhibited a mean tensile strength of 17.9 ksi, and a modulus and elongation of 364 ksi and 33.1% respectively, at room temperature. The coefficient of thermal expansion was 37.3 ppm/°C.

Example 4

By the same method and conditions as described in Example 1 of the present invention, 2.5438 g of oxydiphthalic dianhydride (ODPA) was added to 1.4778 g of 3,4'-oxydianiline (3,4'-ODA) and 0.0887 g of p-phenylene diamine (p-PDA) dissolved in 36.6489 g of dimethylacetamide (DMAc) to form a poly(amide acid) resin having an inherent viscosity of 0.70 dL/g. Resulting polyimide films of ODPA+90:10 3,4'-ODA/p-PDA exhibited a $T_g$ by DSC of 248° C. and 10% weight loss by TGA occurred at 528° C. The film exhibited a mean tensile strength of 18.9 ksi, and a modulus and elongation of 372 ksi and 47.8% respectively, at room temperature. The coefficient of thermal expansion was 37.9 ppm/°C.

Example 5

By the same method and conditions as described in Example 1 of the present invention, 2.5438 g of oxydiphthalic dianhydride (ODPA) was added to 1.1494 g of 3,4'-oxydianiline (3,4'-ODA) and 0.2660 g of p-phenylene diamine (p-PDA) dissolved in 24.3098 g of dimethylacetamide (DMAc) to form a poly(amide acid) resin having an inherent viscosity of 0.95 dL/g. Resulting polyimide films of ODPA+70:30 3,4'-ODA/p-PDA exhibited a $T_g$ by DSC of 257° C and 10% weight loss by TGA occurred at 518° C. The film exhibited a mean tensile strength of 19.2 ksi, and a modulus and elongation of 456 ksi and 9.2% respectively, at RT. The coefficient of thermal expansion was 34.4 ppm/°C.

Example 6

By the same method and conditions as described in Example 1 of the present invention, 2.5438 g of oxydiphthalic dianhydride (ODPA) was added to 0.9031 g of 3,4'-oxydianiline (3,4'-ODA) and 0.3991 g of p-phenylene diamine (p-PDA) dissolved in 27.8800 9 of dimethylacetamide (DMAC) to form a poly(amide acid) resin having an inherent viscosity of 0.73 dL/g. Resulting polyimide films of ODPA+55:45 3,4'-ODA/p-PDA exhibited a $T_g$ by DSC of 259° C. and 10% weight loss by TGA occurred at 516° C. The film exhibited a mean tensile strength of 21.6 ksi, and a modulus and elongation of 531 ksi and 21.8% respectively, at RT. The coefficient of thermal expansion was 28.1 ppm/°C.

Example 7

By the same method and conditions as described in Example 1 of the present invention, 2.4818 g of oxydiphthalic dianhydride (ODPA) was added to 0.9612 g of 3,4'-oxydianiline (3,4'-ODA) and 0.3461 g of p-phenylene diamine (p-PDA) dissolved in 33.2751 g of dimethylacetamide (DMAc) to form a poly(amide acid) resin having an inherent viscosity of 1.28 dL/g. Resulting polyimide films of ODPA+60:40 3,4'-ODA/p-PDA exhibited a $T_g$ by DSC of 251° C. and 10% weight loss by TGA occurred at 527° C. The film exhibited a mean tensile strength of 21.1 ksi, and a modulus and elongation of 506 ksi and 27.6% respectively, at RT. The coefficient of thermal expansion was 33.0 ppm/°C.

Example 8

Reaction of benzophenone tetracarboxylic dianhydride (BTDA) with 4,4-oxydianiline (4,4'-ODA) and p-phenylene diamine (p-PDA).

Into a 100 ml, three-neck round bottom flask equipped with mechanical stirrer, nitrogen gas inlet, and drying tube containing calcium carbonate was placed 4,4-oxydianiline (4,4'-ODA) (1.0813 g, 0.0054 mol), p-phenylene diamine (p-PDA) (0.1947 g, 0.0018 mol), and DMAc (15 g). The solution was stirred until the diamines dissolved. To this solution was added benzophenone tetracarboxylic dianhydride (BTDA) (2.3201 g, 0.0072 mol) and DMAc (16.1393 g). The final solution concentration was 10.35% solids. The solution was stirred at RT overnight under a nitrogen atmosphere. A 0.5% solution of poly(amide acid) in DMAc had an inherent viscosity of 1.38 dL/g measured at 25° C. Thin films were cast from the poly(amide acid) solution and thermally cured by heating for one hour at 100°, 200°, and 300° C. in a forced air oven. The thin film exhibited a $T_g$ by DSC of 277° C. and 10% weight loss by TGA occurred at 519° C. The film exhibited a mean tensile strength of 21.3 ksi, and a modulus and elongation of 468 ksi and 24.0% respectively, at RT. The coefficient of thermal expansion was 32.9 ppm/°C. Moisture uptake by weight was 1.38%.

Example 9

By the same method and conditions as described in Example 8 of the present invention, 2.3201 g of benzophenone tetracarboxylic dianhydride (BTDA) was added to 0.7209 g of 4,4'-oxydianiline (4,4'-ODA) and 0.3893 g of p-phenylene diamine (p-PDA) dissolved in 29.2856 g of dimethylacetamide (DMAc) to form a poly(amide acid) resin having an inherent viscosity of 1.49 dL/g. Resulting polyimide films of BTDA+50:50 4,4'-ODA/p-PDA exhibited a $T_g$ by TMA of 357° C. and 10% weight loss by TGA occurred at 501° C. The film exhibited a mean tensile strength of 25.4 ksi, and a modulus and elongation of 589 ksi and 17.6% respectively, at RT. The coefficient of thermal expansion was 24.8 ppm/°C.

Example 10

By the same method and conditions as described in Example 8 of the present invention, 2.3201 g of benzophenone tetracarboxylic dianhydride (BTDA) was added to 1.2976 g of 4,4'-oxydianiline (4,4'-ODA) and 0.0779 g of p-phenylene diamine (p-PDA) dissolved in 31.2252 g of dimethylacetamide (DMAC) to form a poly(amide acid) resin having an inherent viscosity of 1.21 dL/g. Resulting polyimide films of BTDA+90:10 4,4'-ODA/p-PDA exhibited a $T_g$ by TMA of 276° C. and 10% weight loss by TGA occurred at 519° C. The film exhibited a mean tensile strength of 21.3 ksi, and a modulus and elongation of 468 ksi and 24.0% respectively, at RT. The coefficient of thermal expansion was 32.9 ppm/°C.

Example 11

Reaction of hydroquinone diether dianhydride (HQDEA) with 1,2-bis(4-aminoanilino)cyclobutene-3,4-dione (SAPPD) and 4,4-oxydianiline (4,4'-ODA).

Into a 100 ml, three-neck round bottom flask equipped with mechanical stirrer, nitrogen gas inlet, and drying tube containing calcium carbonate was placed 1,2-bis(4-aminoanilino)cyclobutene-3,4-dione (SAPPD) (0.7505 g, 0.00255 mol), 4,4'-oxydianiline (4,4'-ODA) (1.1914 g, 0.00595 mol), and DMAc (10 g). The solution was stirred until the diamines dissolved. To this solution was added hydroquinone diether dianhydride (3.4197 g, 0.0085 mol) and DMAc (40.7709 g). The final solution concentration was 9.55% solids. The solution was stirred at room temperature overnight under a nitrogen atmosphere. A 0.5% solution of poly(amide acid) in DMAc at 25° C. had an inherent viscosity of 1.03 dL/g. Thin films were cast from the poly(amide acid) solution and thermally cured by heating for one hour at 100°, 200°, and 300° C. in a forced air oven. The thin film exhibited a $T_g$ of 271 ° C. by DSC and 10% weight loss by TGA occurred at 496° C. The film exhibited a mean tensile strength of 15.9 ksi, and a modulus and elongation of 386 ksi and 10.7% respectively, at room temperature. The coefficient of thermal expansion was 39.9 ppm/°C. Moisture uptake by weight was 1.42%.

Example 12

By the same method and conditions described in Example 11 of the present invention, 3.2588 g of hydroquinone diether dianhydride (HQDEA) was added to 0.8110 g of 4,4'-oxydianiline (4,4'-ODA) and 1.1920 g of 1,2-bis(4-aminoanilino)cyclobutene-3,4-dione (SAPPD) dissolved in 65.7458 g of dimethylacetamide (DMAc) to form a poly (amide acid) resin having an inherent viscosity of 2.35 dL/g. Resulting polyimide films of HQDEA+50:50 4,4'-ODA/SAPPD exhibited a $T_g$ by TMA of 277° C. and 10% weight loss by TGA occurred at 470° C. The film exhibited a mean tensile strength of 17.6 ksi, and a modulus and elongation of 456 ksi and 11.3% respectively, at RT. The coefficient of thermal expansion was 35.5 ppm/°C. Moisture uptake by weight was 1.88%.

Example 13

By the same method and conditions described in Example 11 of the present invention, 2.0116 g of hydroquinone diether dianhydride (HQDEA) was added to 0.7509 g of 4,4'-oxydianiline (4,4'-ODA) and 0.3679 g of 1,2-bis(4-aminoanilino)cyclobutene-3,4-dione (SAPPD) dissolved in 25.6263 g of dimethylacetamide (DMAc) to form a poly (amide acid) resin having an inherent viscosity of 1.42 dL/g. Resulting polyimide films of HQDEA+75:25 4,4'-ODA/SAPPD exhibited a $T_g$ of 266° C. by DSC and 10% weight loss by TGA occurred at 503° C. The film exhibited a mean tensile strength of 17.8 ksi, and a modulus and elongation of 388 ksi and 42.7% respectively, at RT. The coefficient of thermal expansion was 38.9 ppm/°C. Moisture uptake by weight was 0.85%.

Example 14

By the same method and conditions described in Example 11 of the present invention, 3.5002 g of hydroquinone diether dianhydride (HQDEA) was added to 1.5679 g of 4,4'-oxydianiline (4,4'-ODA) and 0.2561 g of 1,2-bis(4-aminoanilino)cyclobutene-3,4-dione (SAPPD) dissolved in 53.5329 g of dimethylacetamide (DMAc) to form a poly (amide acid) resin having an inherent viscosity of 1.18 dL/g. Resulting polyimide films of HQDEA+90:10 4,4'-ODA/SAPPD exhibited a $T_g$ by DSC of 251° C. and 10% weight loss by TGA occurred at 516° C. The film exhibited a mean tensile strength of 16.6 ksi, and a modulus and elongation of 377 ksi and 42.2% respectively, at RT. The coefficient of thermal expansion was 42.6 ppm/°C.

Example 15

By the same method and conditions described in Example 11 of the present invention, 3.4197 g of hydroquinone diether dianhydride (HQDEA) was added to 1.0212 g of 4,4'-oxydianiline (4,4'-ODA) and 1.007 g of 1,2-bis(4-aminoanilino)cyclobutene-3,4-dione (SAPPD) dissolved in 71.6206 g of dimethylacetamide (DMAc) to form a poly (amide acid) resin having an inherent viscosity of 1.45 dL/g. Resulting polyimide films of HQDEA+60:40 4,4'-ODA/SAPPD exhibited a $T_g$ by DSC of 254° C. and 10% weight loss by TGA occurred at 474° C. The film exhibited a mean tensile strength of 17.2 ksi, and a modulus and elongation of 387 ksi and 11.1% respectively, at RT. The coefficient of thermal expansion was 37.0 ppm/°C.

Example 16

By the same method and conditions described in Example 11 of the present invention, 3.0576 g of hydroquinone diether dianhydride (HQDEA) was added to 2.2386 g of 1,2-bis(4-aminoanilino)cyclobutene-3,4-dione (SAPPD) dissolved in 78.0760 g of dimethylacetamide (DMAc) to form a poly(amide acid) resin having an inherent viscosity of 2.72 dL/g. Resulting polyimide films of HQDEA+SAPPD did not exhibit a $T_g$ by DSC and 10% weight loss by TGA occurred at 407° C. The film exhibited a mean tensile strength of 21.4 ksi, and a modulus and elongation of 666 ksi and 7.8% respectively, at room temperature. The coefficient of thermal expansion was not detected. Moisture uptake by weight was 2.36%.

Example 17

Reaction of oxydiphthalic dianhydride (ODPA) with 1,2-bis(4-aminoanilino)cyclobutene-3,4-dione (SAPPD) and 3,4-oxydianiline (3,4'-ODA).

Into a 100 ml, three-neck round bottom flask equipped with mechanical stirrer, nitrogen gas inlet, and drying tube containing calcium carbonate was placed 1,2-bis(4-aminoanilino)cyclobutene-3,4-dione (SAPPD) (0.5651 g, 0.00192 mol), 3,4'-oxydianiline (3,4'-ODA) (1.5379 g, 0.00768 mol), and DMAc (20 g). The solution was stirred until the diamines dissolved. To this solution was added oxydiphthalic anhydride (ODPA) (2.9781 g, 0.0096 mol) and DMAc (33.5457 g). The final solution concentration was 9.49% solids. The solution was stirred at RT overnight under a nitrogen atmosphere. A 0.5% solution of poly(amide acid) in DMAc had an inherent viscosity of 1.23 dL/g measured at 25° C. Thin films were cast from the poly(amide acid) solution and thermally cured by heating for one hour at 100°, 200°, and 300° C. in a forced air oven. The thin film exhibited a $T_g$ by DSC of 252° C. and 10% weight loss by TGA occurred at 505° C. The film exhibited a mean tensile strength of 20.7 ksi, and a modulus and elongation of 463 ksi and 10.6% respectively, at room temperature. The coefficient of thermal expansion was 36.0 ppm/°C. Moisture uptake by weight was 0.88%.

Example 18

By the same method and conditions as described in Example 17 of the present invention, 2.9781 g of oxydiphthalic dianhydride (ODPA) was added to 0.9612 g of 3,4'-oxydianiline (3,4'-ODA) and 1.4127 g of 1,2-bis(4-aminoanilino)cyclobutene-3,4-dione (SAPPD) dissolved in 47.3337 g of dimethylacetamide (DMAc) to form a poly (amide acid) resin having an inherent viscosity of 1.14 dL/g. Resulting polyimide films of the ODPA+50:50 3,4'-ODA/SAPPD did not exhibit a $T_g$ by DSC and 10% weight loss by TGA occurred at 456° C. The film exhibited a mean tensile strength of 18.8 ksi, and a modulus and elongation of 601 ksi and 4.2% respectively, at room temperature. The coefficient of thermal expansion was 30.8 ppm/°C.

Example 19

By the same method and conditions as described in Example 17 of the present invention, 2.9781 g of oxydiphthalic dianhydride (ODPA) was added to 1.4417 g of 3,4'-oxydianiline (3,4'-ODA) and 0.7064 9 of 1,2-bis(4-aminoanilino)cyclobutene-3,4-dione (SAPPD) dissolved in 55.2011 g of dimethylacetamide (DMAc) to form a poly (amide acid) resin having an inherent viscosity of 1.19 dL/g. Resulting polyimide films of ODPA+75:25 3,4'-ODA/SAPPD exhibited a $T_g$ by TMA of 261° C. and 10% weight loss by TGA occurred at 503° C. The film exhibited a mean tensile strength of 18.5 ksi, and a modulus and elongation of 494 ksi and 9.6% respectively, at room temperature. The coefficient of thermal expansion was 34.2 ppm/°C.

Example 20

By the same method and conditions as described in Example 17 of the present invention, 2.9781 g of oxydiphthalic dianhydride (ODPA) was added to 1.7301 g of 3,4'-oxydianiline (3,4'-ODA) and 0.2825 g of 1,2-bis(4-aminoanilino)cyclobutene-3,4-dione (SAPPD) dissolved in 38.7055 g of dimethylacetamide (DMAc) to form a poly (amide acid) resin having an inherent viscosity of 1.30 dL/g. Resulting polyimide films of the ODPA+90:10 3,4'-ODA/SAPPD exhibited a $T_g$ by DSC of 249° C. and 10% weight loss occurred at 518° C. The film exhibited a mean tensile strength of 18.6 ksi, and a modulus and elongation of 439 ksi and 63.4% respectively, at room temperature. The coefficient of thermal expansion was 38.5 ppm/°C.

Example 21

Into a 500 ml, three-neck round bottom flask equipped with mechanical stirrer, nitrogen gas inlet, and drying tube containing calcium carbonate was placed 1,2-bis(4-aminoanilino)cyclobutene-3,4-dione (SAPPD) (5.8863 g, 0.0200 mol), 3,4'-oxydianiline (3,4'-ODA) (16.0194 g, 0.08 mol), and N-methylpyrollidinone (NMP) (150 g). The solution was stirred until the diamines dissolved. To this solution was added oxydiphthalic anhydride (ODPA) (31.0223 g, 0.1000 mol) and NMP (141.75 g). The final solution concentration was 15.35% solids. The solution was stirred at RT overnight under a nitrogen atmosphere. A 0.5% solution of poly(amide acid) in NMP had an inherent viscosity of 1.03 dL/g measured at 25° C.

Example 22

Controlled molecular weight polyimide copolymers by stoichiometric imbalance and endcapping with phthalic anhydride.

Into a 100 ml, three-neck round bottom flask equipped with mechanical stirrer, nitrogen gas inlet, and drying tube containing calcium carbonate was placed 1,2-bis(4-aminoanilino)cyclobutene-3,4-dione (SAPPD) (0.5886 g, 0.0020 mol), 3,4'-oxydianiline (3,4'-ODA) (1.6019 g, 0.0080 mol), phthalic anhydride (0.0592 g, 0.0004 mol), and N-methylpyrollidinone (NMP) (20 g). The solution was stirred until the diamines dissolved. To this solution was added oxydiphthalic anhydride (ODPA) (3.0402 g, 0.0098 mol) and NMP (13.7865 g). The final solution concentration was 13.40% solids. The solution was stirred at RT overnight under a nitrogen atmosphere. A 0.5% solution of poly(amide acid) in NMP had an inherent viscosity of 0.6 dL/g measured at 25° C.

What is claimed is:

1. A random copoly(amide) acid having the following general structural formula:

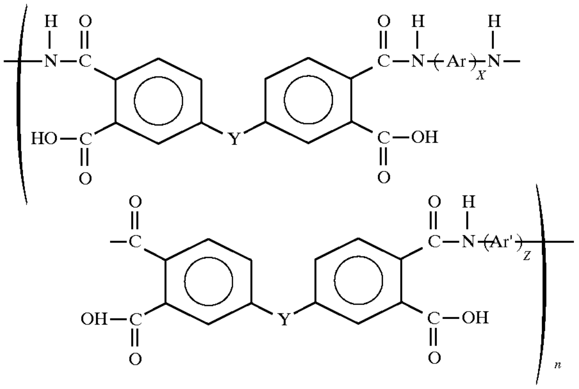

where n=10–100;

Y is a member selected from the group consisting of:

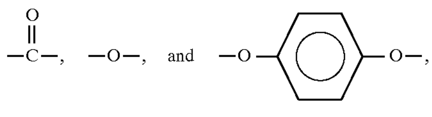

Ar is a member selected from the group consisting of:

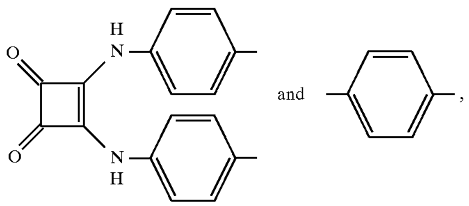

Ar' is:

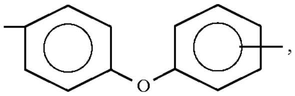

x is 1–99 molar percent, z is 1–99 molar percent.

2. A copoly(amide) acid of claim 1 wherein Y is

—O—, Ar is 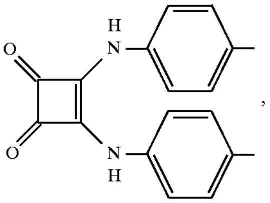

Ar' is 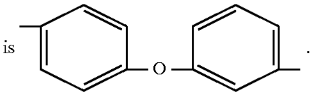

3. A copoly(amide) acid of claim 1 wherein Y is

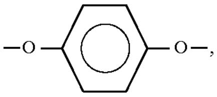, Ar is 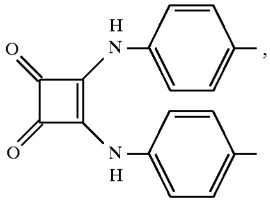

Ar is 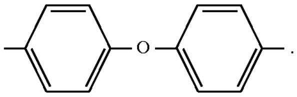

4. A copoly(amide) acid of claim 1 wherein Y is

—O—, Ar is 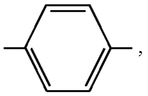

-continued

Ar'is 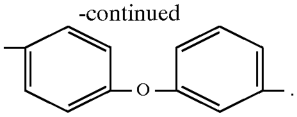

5. A copoly(amide) acid of claim 1 wherein Y is

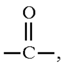, Ar is 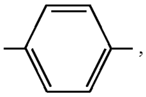

Ar' is 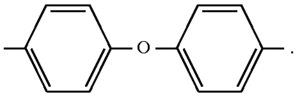

6. A random copolyimide having the following general structural formula:

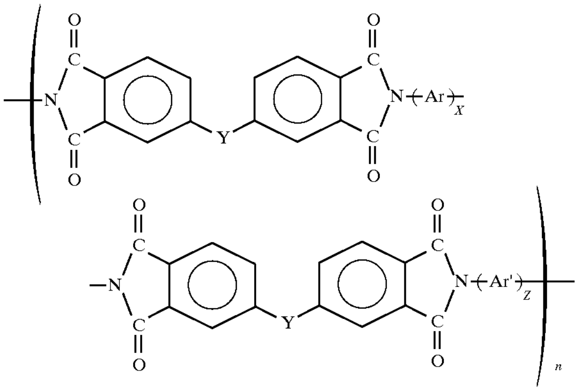

where n 10–100;

Y is a member selected from the group consisting of:

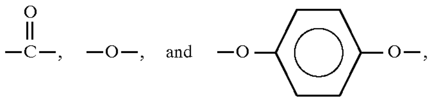

Ar is a member selected from the group consisting of:

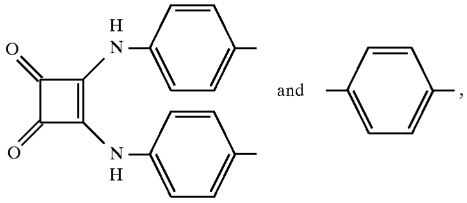

Ar' is:

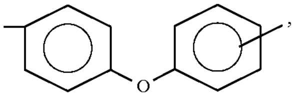

X is 1–99 molar percent,

Z is 1–99 molar percent.

7. A copolyimide of claim 6 wherein Y is

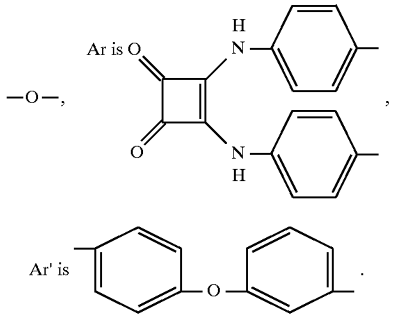

8. A copolyimide of claim 6 wherein Y is

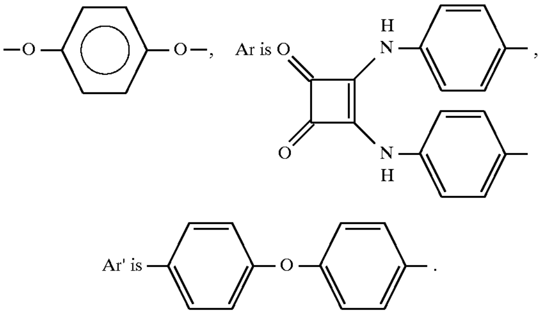

9. A copolyimide of claim 6 wherein Y is

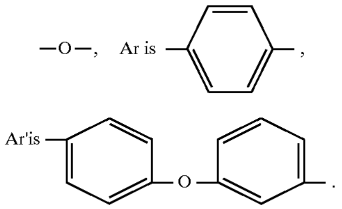

10. A copolyimide of claim 6

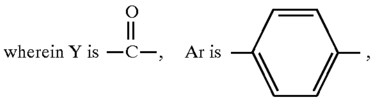

-continued

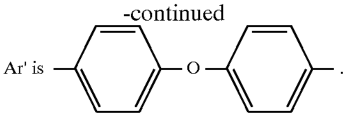

11. A random copoly(amide) solution prepared from the copoly(amide) acid of claim 1.

12. A random high molecular weight copoly(amide) solution prepared from the copoly(amide) acid of claim 1.

13. A film prepared from a solution of the random copoly(amide) acid of claim 11.

14. A film of claim 13, wherein molecular weight has been controlled by encapping.

15. A coating composition prepared from a solution of the random copoly(amide) acid of claim 11.

16. A coating composition of claim 15, wherein molecular weight has been controlled.

17. A random copolyimide of claim 6, which is prepared by:

combining two diamines in a solvent with an equimolar amount of aromatic dianhydride;

wherein one of said diamines is selected from the group consisting of 1,2-bis(4-aminoanilino)-cyclobutene-3,4-dione and p-phenylene diamine;

wherein the second said diamine is selected from the group consisting of 4,4'-oxydianiline and 3,4'-oxydianiline;

wherein said aromatic dianhydride is selected from the group consisting of hydroquinone diether dianhydride, oxydiphthalic dianhydride and benzophenone tetracarboylic dianhydride.

18. A process for preparing a random copolyimde of claim 17, wherein said dianhydride is hydroquinone diether dianhydride and said diamines are 1,2-bis(4-aminoanilino) -cyclobutene-3,4-dione and 4,4'oxydianiline.

19. A process for preparing a copolyimde of claim 17, wherein said dianhydride is oxydiphthalic dianhydride and said diamines are 1,2-bis(4-aminoanilino)-cyclobutene-3,4-dione and 3,4'oxydianiline.

20. A process for preparing a random copolyimde of claim 17, wherein said dianhydride is oxydiphthalic dianhydride and said diamines are p-phenylene and 3,4'oxydianiline.

21. A process for preparing a copolyimde of claim 17, wherein said dianhydride is benzophenone tetracarboxylic dianhydride and said diamines are p-phenylene and 4,4'oxydianiline.

* * * * *